(12) United States Patent
Lee et al.

(10) Patent No.: US 12,048,155 B2
(45) Date of Patent: Jul. 23, 2024

(54) SEMICONDUCTOR MEMORY DEVICE AND MANUFACTURING METHOD OF THE SEMICONDUCTOR MEMORY DEVICE

(71) Applicant: SK hynix Inc., Icheon-si Gyeonggi-do (KR)

(72) Inventors: Dong Hwan Lee, Icheon-si Gyeonggi-do (KR); Seo Hyun Kim, Icheon-si Gyeonggi-do (KR); Eun Seok Choi, Icheon-si Gyeonggi-do (KR)

(73) Assignee: SK hynix inc., Icheon-si (KR)

( * ) Notice: Subject to any disclaimer, the term of this patent is extended or adjusted under 35 U.S.C. 154(b) by 262 days.

(21) Appl. No.: 17/397,546

(22) Filed: Aug. 9, 2021

(65) Prior Publication Data

US 2022/0310644 A1    Sep. 29, 2022

(30) Foreign Application Priority Data

Mar. 24, 2021    (KR) .......................... 10-2021-0038267

(51) Int. Cl.
| | |
|---|---|
| H10B 43/27 | (2023.01) |
| H01L 23/00 | (2006.01) |
| H01L 25/00 | (2006.01) |
| H01L 25/065 | (2023.01) |
| H01L 25/18 | (2023.01) |

(Continued)

(52) U.S. Cl.
CPC ............. *H10B 43/27* (2023.02); *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H10B 41/41* (2023.02); *H10B 43/40* (2023.02); *H01L 2224/08145* (2013.01); *H01L 2224/80895* (2013.01); *H01L 2224/80896* (2013.01);

(Continued)

(58) Field of Classification Search
CPC ........ H10B 43/27; H10B 41/27; H10B 41/41; H10B 43/40; H01L 24/08; H01L 25/0657; H01L 25/18; H01L 2224/08145; H01L 2224/80895; H01L 2224/80896; H01L 2924/1431; H01L 2924/14511; H01L 24/80; H01L 25/50
See application file for complete search history.

(56) References Cited

U.S. PATENT DOCUMENTS 10,629,616 B1    4/2020  Kai et al.
2017/0330887 A1*  11/2017  Kim ....................... H10B 20/60

(Continued)

FOREIGN PATENT DOCUMENTS

| KR | 1020100133671 A | 12/2010 |
|---|---|---|
| KR | 1020120006843 A | 1/2012 |

(Continued)

*Primary Examiner* — Thanh Y. Tran
(74) *Attorney, Agent, or Firm* — WILLIAM PARK & ASSOCIATES LTD.

(57) ABSTRACT

A semiconductor memory device and a method of manufacturing the semiconductor memory device are provided. The semiconductor memory device includes a channel layer with a first portion and a second portion, the first portion and the second portion extending in a longitudinal direction, a gate stacked structure surrounding the first portion of the channel layer, a first semiconductor layer of a first conductivity type that contacts the second portion of the channel layer, and a second semiconductor layer of a second conductivity type.

20 Claims, 16 Drawing Sheets

(51) Int. Cl.
   *H10B 41/27*     (2023.01)
   *H10B 41/41*     (2023.01)
   *H10B 43/40*     (2023.01)

(52) U.S. Cl.
   CPC ................. *H01L 2924/1431* (2013.01); *H01L 2924/14511* (2013.01)

(56) References Cited

U.S. PATENT DOCUMENTS

| | | | |
|---|---|---|---|
| 2019/0115362 A1* | 4/2019 | Choi | H10B 43/50 |
| 2020/0350326 A1* | 11/2020 | Yun | H10B 43/10 |
| 2021/0028184 A1* | 1/2021 | Kim | H10B 43/40 |
| 2022/0037352 A1* | 2/2022 | Zhang | H10B 43/40 |
| 2022/0310644 A1 | 9/2022 | Lee et al. | |

FOREIGN PATENT DOCUMENTS

| | | |
|---|---|---|
| KR | 1020220133011 A | 10/2022 |
| KR | 1020230006323 A | 1/2023 |

* cited by examiner

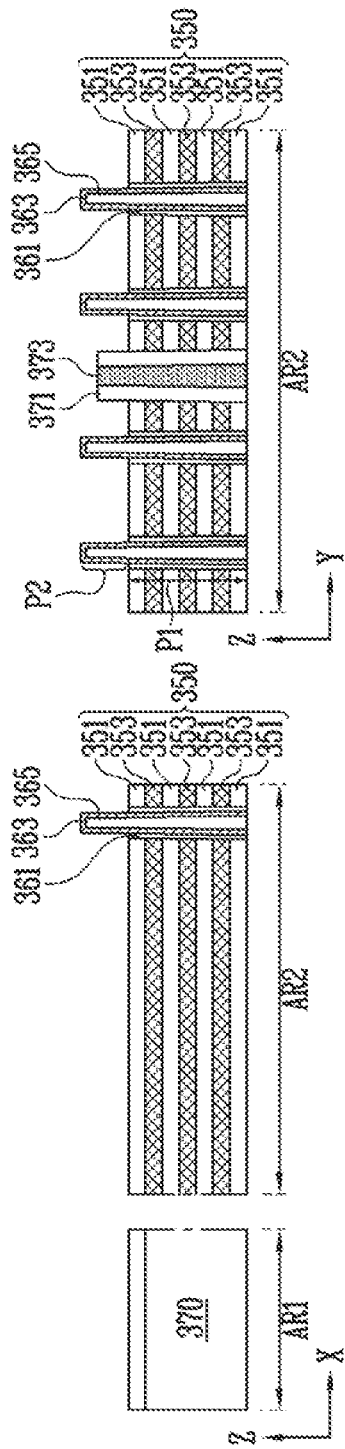
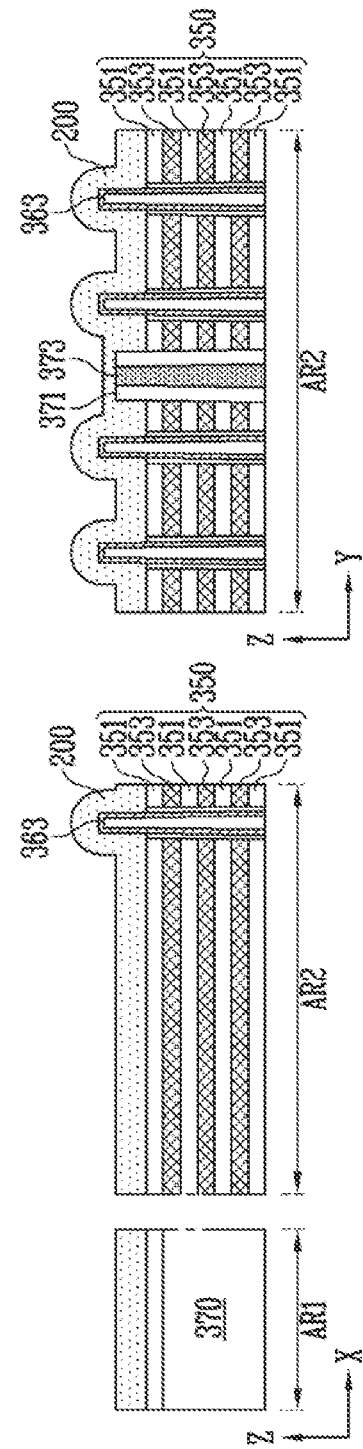

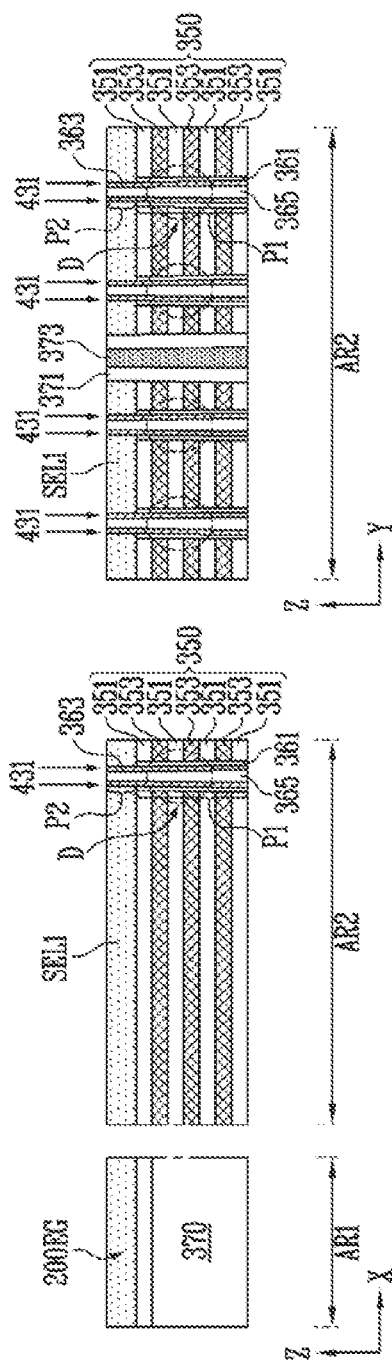
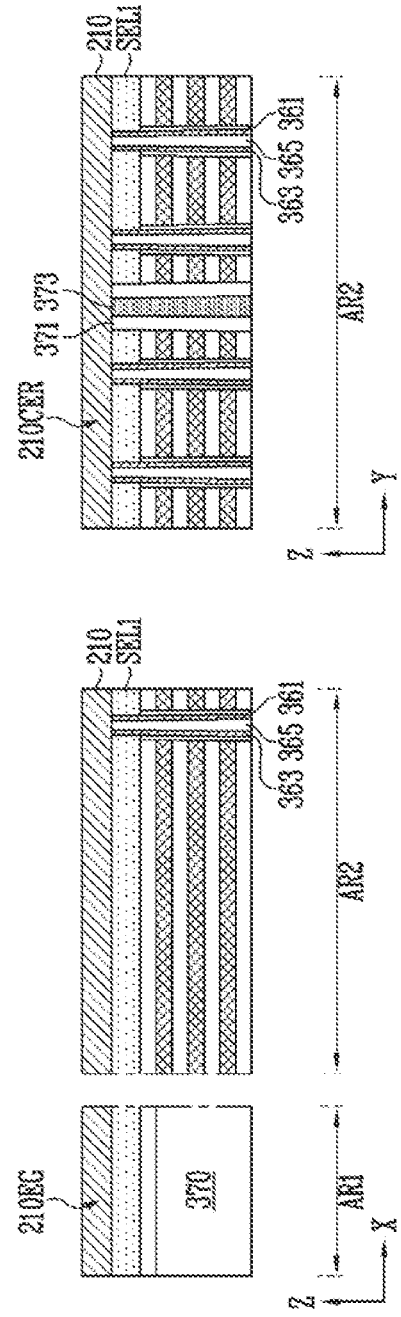

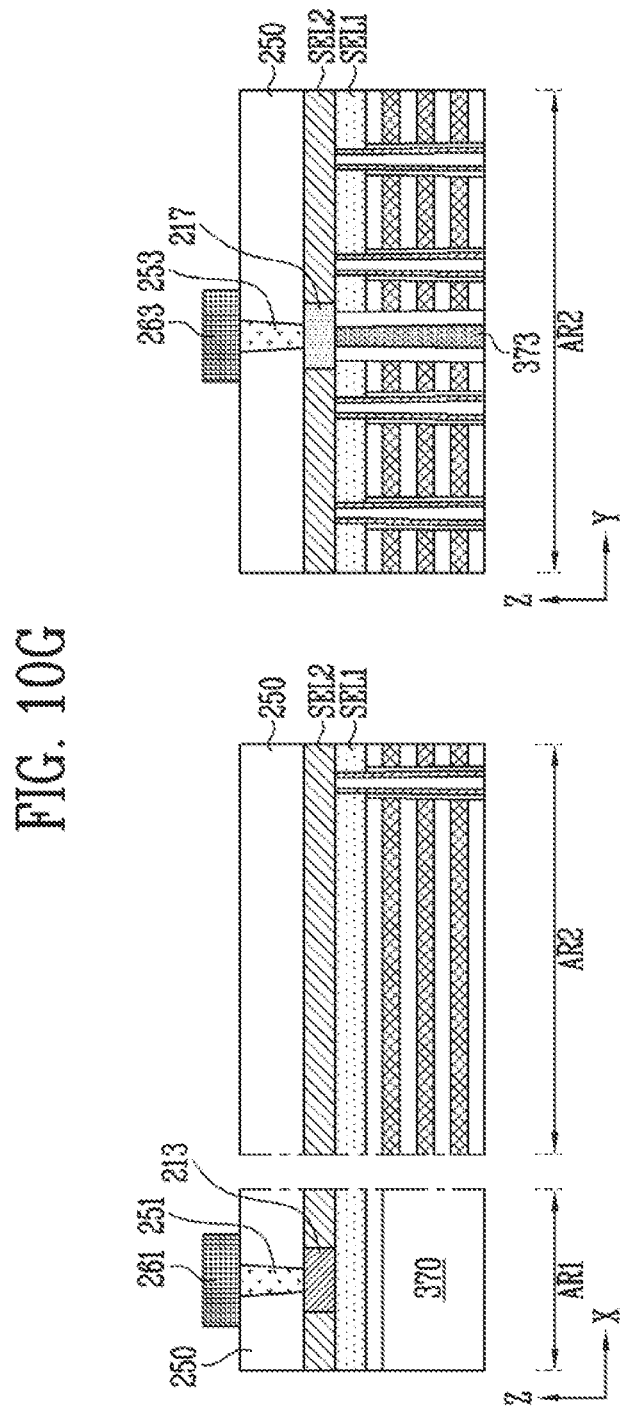

SEMICONDUCTOR MEMORY DEVICE AND MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2021-0038267, filed on Mar. 24, 2021, in the Korean Intellectual Property Office, the entire disclosure of which is incorporated herein by reference.

BACKGROUND

1. Technical Field

Various embodiments of the present disclosure generally relate to a semiconductor memory device and a method of manufacturing the semiconductor memory device, and more particularly, to a three-dimensional semiconductor memory device and a method of manufacturing the three-dimensional semiconductor memory device.

2. Related Art

A semiconductor memory device may include memory cells capable of storing data. A three-dimensional semiconductor memory device may include a three-dimensional memory cell array.

Various operations of the memory cells may be controlled by a peripheral circuit structure. The three-dimensional semiconductor memory device may include the peripheral circuit structure that overlaps with the three-dimensional memory cell array. In the three-dimensional semiconductor memory device as described above, due to constrains of structure and constraints of manufacturing process, an erase operation for erasing data that is stored in the memory cells may be limited to a Gate Induced Drain Leakage (GIDL) method using a Gate Induced Drain Leakage (GIDL) current. The erase operation according to the GIDL method may be performed based on a minority carrier, and therefore reliability of the erase operation may deteriorate.

SUMMARY

According to an embodiment, a semiconductor memory device may include a channel layer with a first portion and a second portion, the first portion and the second portion extending in a longitudinal direction, a gate stacked structure surrounding the first portion of the channel layer, a first semiconductor layer including a first impurity of a first conductivity type, the first semiconductor layer contacting a sidewall of the second portion of the channel layer, and a second semiconductor layer covering the first semiconductor layer and the channel layer, wherein the second semiconductor layer includes a source region that is doped with a second impurity of a second conductivity type that is opposite to the first conductivity type.

According to an embodiment, a semiconductor memory device may include a three-dimensional memory cell array, a first semiconductor layer overlapping with the three-dimensional memory cell array, the first semiconductor layer including a first impurity of a first conductivity type, and a second semiconductor layer disposed over the first semiconductor layer, the second semiconductor layer including a source region that is doped with a second impurity of a second conductivity type that is opposite to the first conductivity type, wherein the three-dimensional memory cell array includes channel layers, each with a first contact surface that contacts the first semiconductor layer and a second contact surface that contacts the second semiconductor layer.

According to an embodiment, a method of manufacturing a semiconductor memory device may include forming channel layers, each including a first portion that is surrounded by a gate stacked structure with a memory layer that is interposed therebetween and a second portion that extends from the first portion and is exposed to an area that is outside of the gate stacked structure, forming a first semiconductor layer that contacts a part of the second portion of each of the channel layers, the first semiconductor layer including a first impurity of a first conductivity type, and forming a second semiconductor layer contacting a part of the second portion of each of the channel layers that is opened by the first semiconductor layer, the second semiconductor layer including a second impurity of a second conductivity type that is opposite to the first conductivity type.

BRIEF DESCRIPTION OF THE DRAWINGS

FIGS. 10A to 10G are cross-sectional diagrams illustrating an embodiment of processes subsequent to a process shown in FIG. 9C;

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements.

Various embodiments are directed to a semiconductor memory device capable of improving operational reliability and a method of manufacturing the semiconductor memory device.

Figure 1:
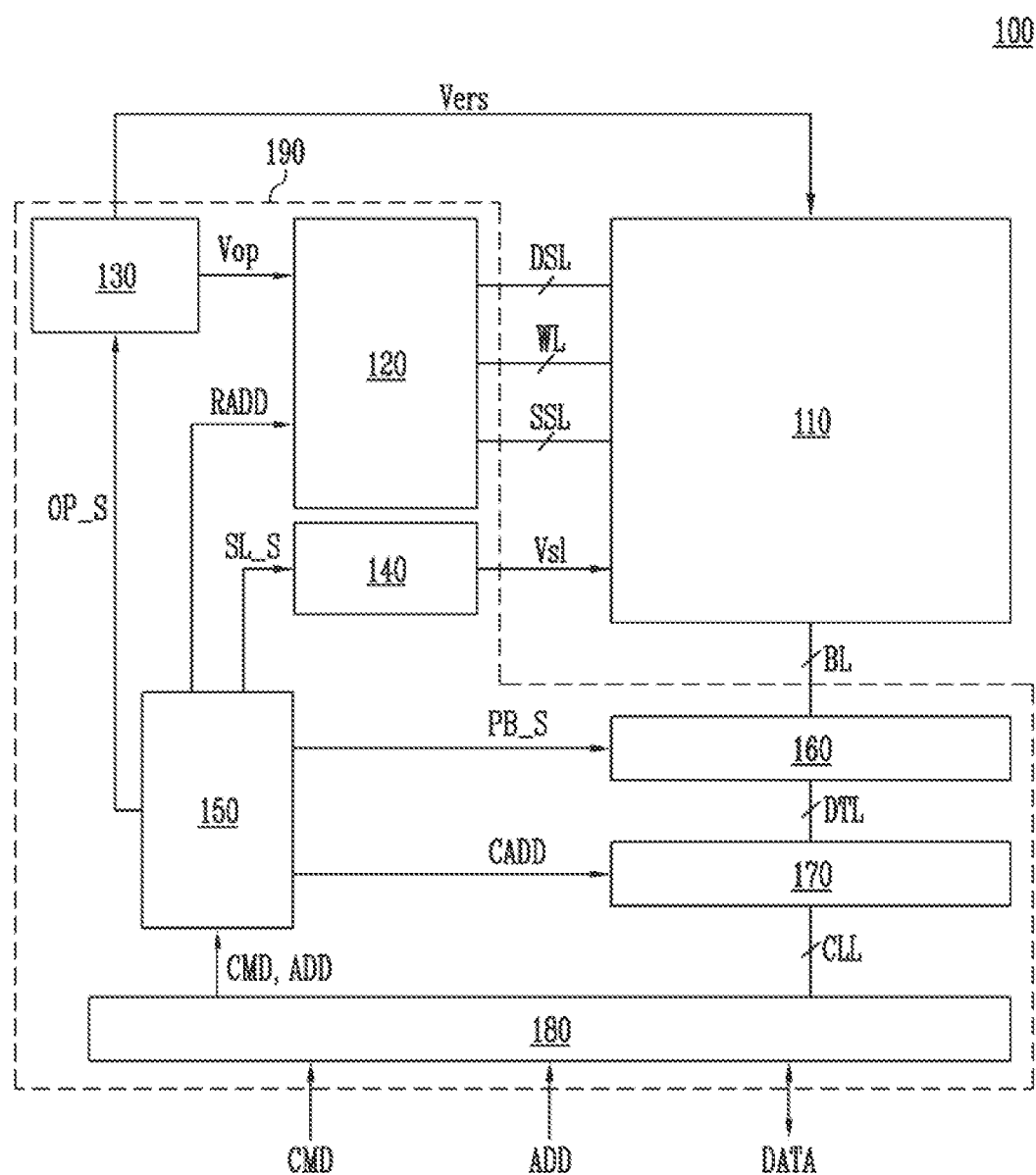
FIG. 1 is a block diagram of a semiconductor memory device according to an embodiment.

FIG. 1 is a block diagram of a semiconductor memory device 100 according to an embodiment.

Referring to FIG. 1, the semiconductor memory device 100 may include a peripheral circuit structure 190 and a memory cell array 110.

The peripheral circuit structure 190 may be configured to perform a program operation and a verify operation for storing data in the memory cell array 110, a read operation for outputting the data that is stored in the memory cell array 110, and an erase operation for erasing the data that is stored in the memory cell array 110. The peripheral circuit structure 190 may include an input/output circuit 180, a control circuit 150, a voltage generating circuit 130, a row decoder 120, a column decoder 170, a page buffer 160, and a source line driver 140.

The memory cell array 110 may include a plurality of memory cells that stores data. According to an embodiment, the memory cell array 110 may include a three-dimensional memory cell array. The plurality of memory cells may store a single bit of data or multi-bits of data per cell. The plurality of memory cells may form memory cell strings. Each of the memory cell strings may include memory cells that are coupled, in series with each other, through a channel layer. The channel layer may be coupled to the page buffer 160 through bit lines BL. The channel layer may include a part that is coupled to a first semiconductor layer of the memory cell array 110 and a part that is coupled to a source region of the memory cell array 110. The first semiconductor layer may be provided as a well region that is doped with a first impurity of a first conductivity type. The source region may be a region in a second semiconductor layer that is doped with a second impurity of a second conductivity type that is opposite to the first conductivity type. The first conductivity type may be a p type, and the second conductivity type may be an n type.

The input/output circuit 180 may transfer a command CMD and an address ADD that are received from an external device (for example, a memory controller) of the semiconductor memory device 100 to the control circuit 150. The input/output circuit 180 may exchange data DATA with the external device and the column decoder 170.

The control circuit 150 may output an operation signal OP_S, a row address RADD, a source line control signal SL_S, a page buffer control signal PB_S, and a column address CADD in response to the command CMD and the address ADD.

The voltage generating circuit 130 may generate various operating voltages Vop that are used for performing the program operation, the verify operation, the read operation, and the erase operation in response to the operation signal OP_S. The voltage generating circuit 130 may transfer an erase voltage Vers to the memory cell array 110 during the erase operation in response to the operation signal OP_S. During the erase operation, the erase voltage Vers may be transferred to the first semiconductor layer of the memory cell array 110. The first semiconductor layer may supply a hole that is a majority carrier to the channel layer during the erase operation.

The row decoder 120 may be coupled to the memory cell array 110 through drain select lines DSL, word lines WL, and source select lines SSL. The row decoder 120 may transfer the operating voltages Vop to the drain select lines DSL, the word lines WL, and the source select lines SSL in response to the row address RADD.

The column decoder 170 may transfer the data DATA input from the input/output circuit 180 to the page buffer 160 or transfer the data DATA that is stored in the page buffer 160 to the input/output circuit 180 in response to the column address CADD. The column decoder 170 may exchange the data DATA with the input/output circuit 180 through column lines CLL. The column decoder 170 may exchange the data DATA with the page buffer 160 through data lines DTL.

The page buffer 160 may be coupled to the memory cell array 110 through the bit lines BL. The page buffer 160 may temporarily store the data DATA that is received through the bit lines BL in response to the page buffer control signal PB_S. The page buffer 160 may sense a voltage or a current of the bit lines BL during the read operation.

The source line driver 140 may transfer a source voltage Vsl to the memory cell array 110 in response to the source line control signal SL_S. According to an embodiment, the source line driver 140 may supply the source voltage Vsl for discharging to a source region of the memory cell array 110 during the read operation or the verify operation. According to an embodiment, the source voltage Vsl for discharge may be a ground voltage.

Figure 2:
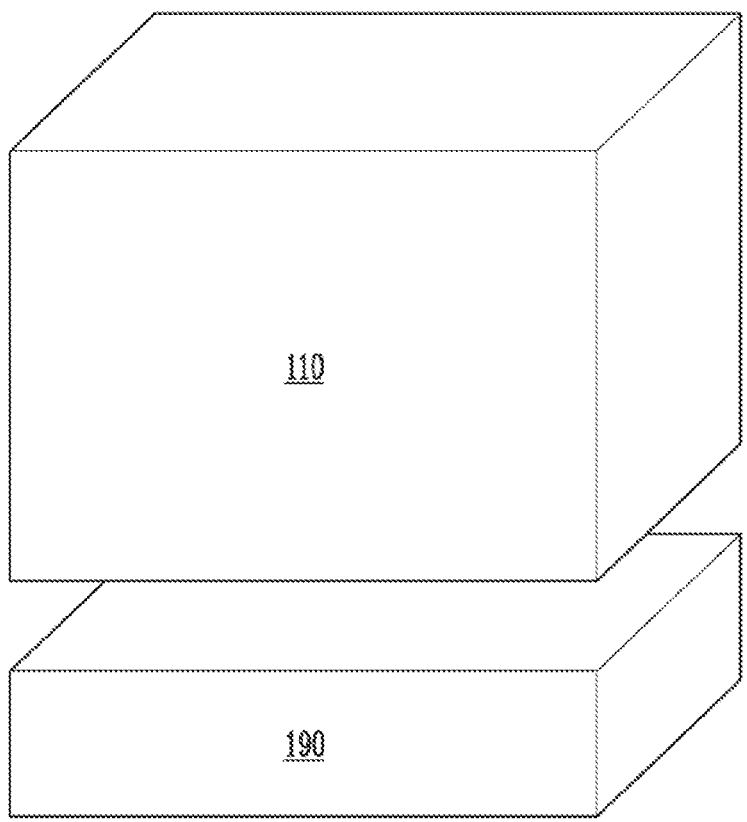
FIG. 2 is a diagram illustrating an embodiment of an arrangement of a memory cell array and a peripheral circuit structure shown in FIG. 1.

FIG. 2 is a diagram illustrating an embodiment of an arrangement of the memory cell array 110 and the peripheral circuit structure 190 shown in FIG. 1.

Referring to FIG. 2, the peripheral circuit structure 190 of the semiconductor memory device 100 may include a region that overlaps with the memory cell array 110. A Z-axis direction in an XYZ coordinate system may be defined as a direction in which the peripheral circuit structure 190 faces the memory cell array 110. The peripheral circuit structure 190 may be coupled to the first semiconductor layer, the second semiconductor layer, the bit lines, the drain select lines, the word lines, and the source select lines of the memory cell array 110 through a plurality of interconnections.

Figure 3:
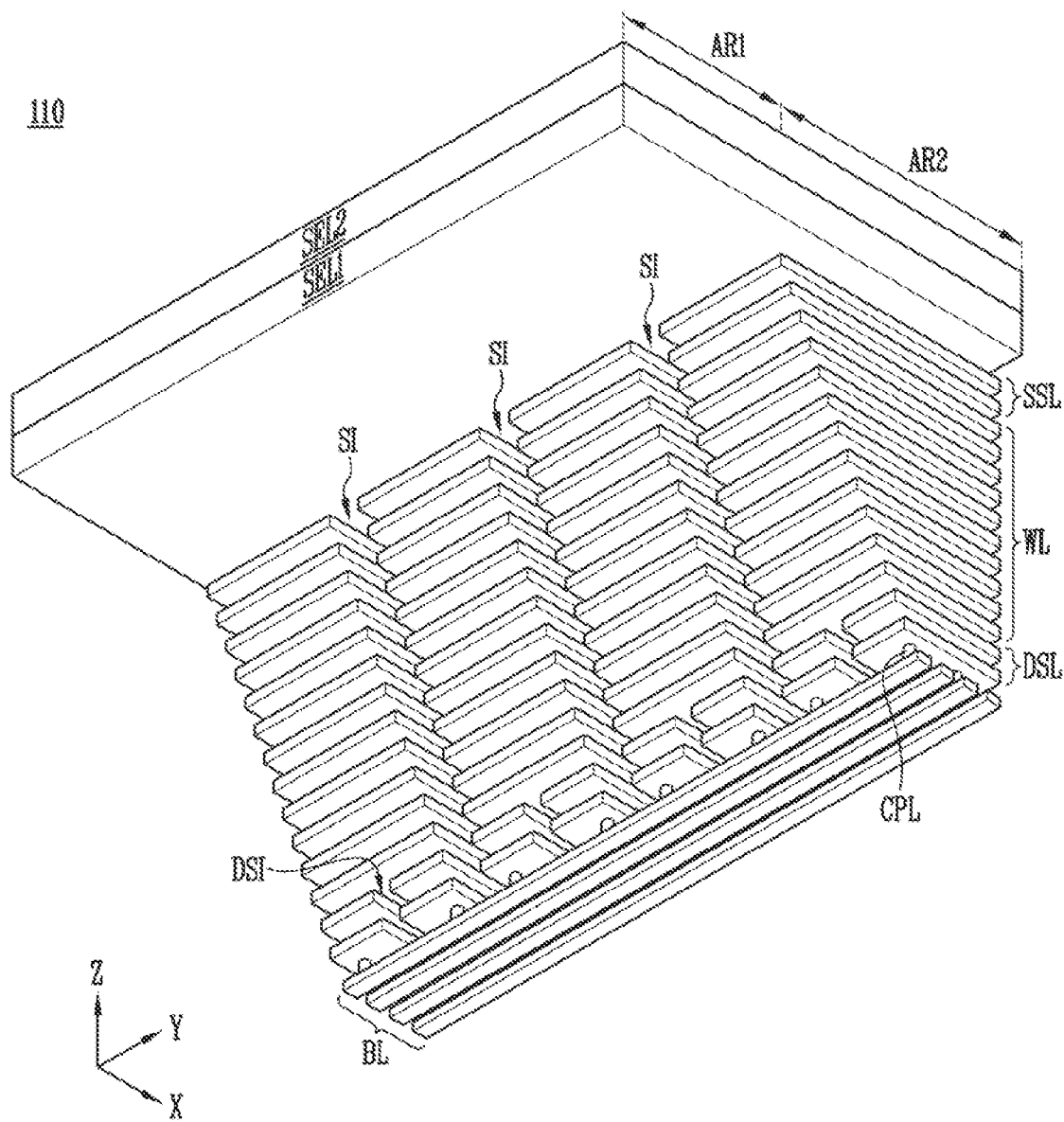
FIG. 3 is a perspective view illustrating an embodiment of a memory cell array shown in FIG. 2.

FIG. 3 is a perspective view illustrating an embodiment of the memory cell array 110 shown in FIG. 2.

Referring to FIG. 3, the memory cell array 110 may include memory cell strings, the bit lines BL, a first semiconductor layer SEL1, and a second semiconductor layer SEL2 defined along cell plugs CPL.

The first semiconductor layer SEL1 and the second semiconductor layer SEL2 may overlap with the bit lines BL, the cell plugs CPL being interposed therebetween.

The cell plugs CPL may be surrounded by conductive patterns that are stacked to be spaced apart from each other in the Z-axis direction between a level at which the bit lines BL are disposed and a level at which the first semiconductor layer SEL1 is disposed. A three-dimensional memory cell array may be defined by the cell plugs CPL as described above. The conductive patterns may be penetrated by slits SI. At least one layer of a conductive pattern that is adjacent to the bit lines BL among the conductive patterns may be penetrated by drain separation slits DSI as well as the slits SI. The conductive patterns may be separated into the drain select lines DSL, the word lines WL, and the source select lines SSL by the slits SI and the drain separation slits DSI. The drain select lines DSL that are disposed at the same level between the slits SI that neighbor each other may be separated from each other by the drain separation slit DSI.

The drain select lines DSL may serve as gate electrodes of drain select transistors. The word lines WL may serve as gate electrodes of the memory cells. The source select lines SSL may serve as gate electrodes of source select transistors.

Each of the cell plugs CPL may pass through at least one layer of the drain select lines DSL, the plurality of word lines WL, and at least one layer of the source select lines SSL. The plurality of word lines WL may be disposed to be spaced apart from each other in the Z-axis direction between the bit lines BL and the first semiconductor layer SEL1. At least one layer of the drain select lines DSL may be disposed between the plurality of word lines WL and the bit lines BL. At least one layer of the source select lines SSL may be disposed between the plurality of word lines WL and the first semiconductor layer SEL1.

The bit lines BL may extend in a direction that intersects the word lines WL. According to an embodiment, the word lines WL may extend in an X-axis direction in the XYZ coordinate system, and the bit lines BL may extend in a Y-axis direction in the XYZ coordinate system.

The first semiconductor layer SEL1 may be provided as a well region of the memory cell array 110 and may extend along an X-Y plane in the XYZ coordinate system. The second semiconductor layer SEL2 of the memory cell array 110 may include the source region and may extend along the X-Y plane in the XYZ coordinate system. The second semiconductor layer SEL2 may contact an upper surface of the first semiconductor layer SEL1.

Each of the first semiconductor layer SEL1 and the second semiconductor layer SEL2 may extend from a first region AR1 of the semiconductor memory device to a second region AR2 of the semiconductor memory device. The drain select lines DSL, the word lines WL, and the source select lines SSL may be penetrated by the cell plugs CPL in the second region AR2. The first region AR1 of the semiconductor memory device may be a region that is opened by the drain select lines DSL, the word lines WL, and the source select lines SSL.

The first semiconductor layer SEL1 may include the first impurity of the first conductivity type. According to an embodiment, the first semiconductor layer SEL1 may be a doped silicon layer with a p-type impurity.

The second semiconductor layer SEL2 may include a region that is doped with an impurity of the first conductivity type and a region that is doped with an impurity of the second conductivity type that is the opposite of the first conductivity type. According to an embodiment, the second semiconductor layer SEL2 may include a well pickup region that is doped with the p-type impurity and the source region and a source pickup region that is doped with an n-type impurity.

Figure 4:
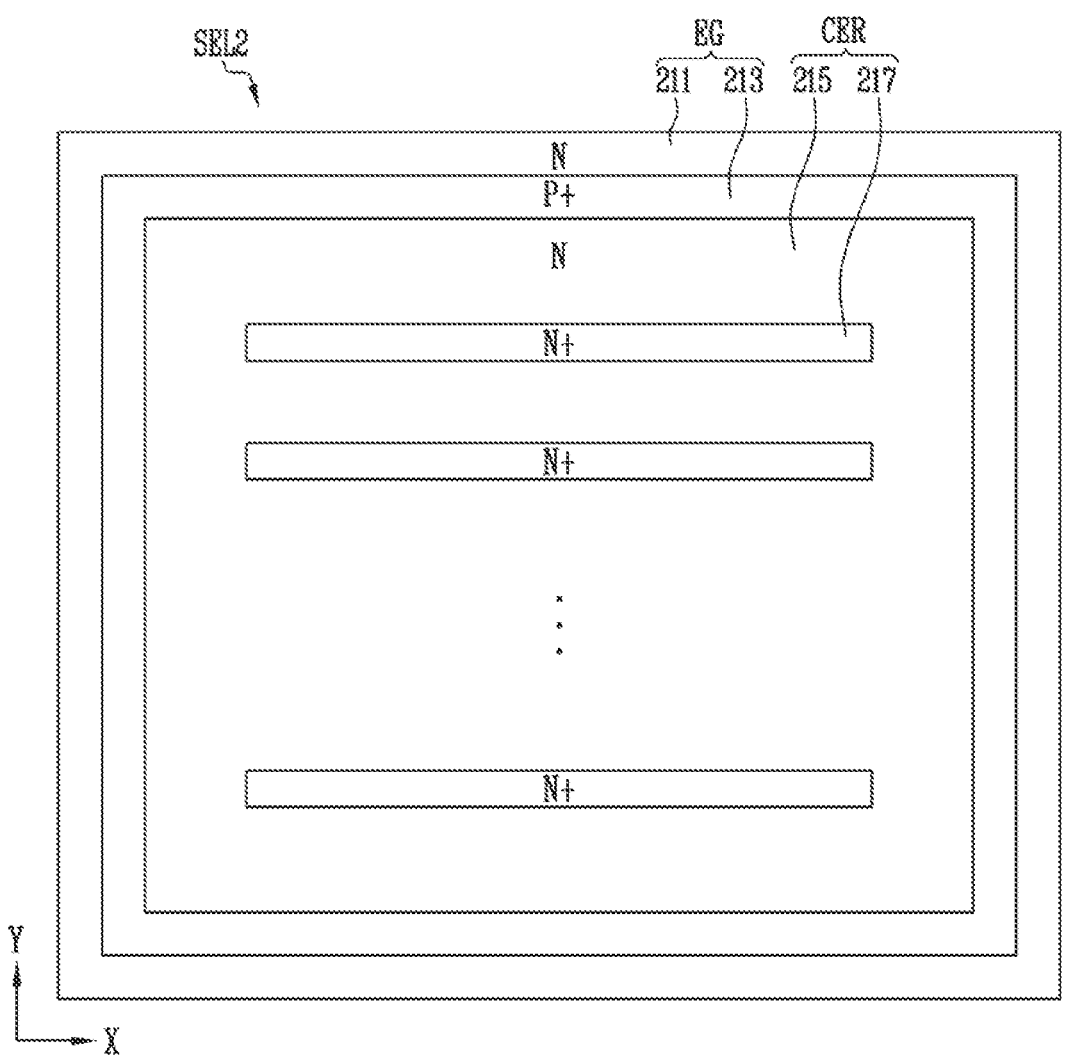
FIG. 4 is a plan view illustrating an embodiment of a second semiconductor layer shown in FIG. 3.

FIG. 4 is a plan view illustrating an embodiment of the second semiconductor layer SEL2 shown in FIG. 3.

Referring to FIG. 4, the second semiconductor layer SEL2 may include a central region CER and an edge EG that surrounds the central region CER. The edge EG may correspond to the first region AR1, shown in FIG. 3, and the central region CER may correspond to the second region AR2 shown in FIG. 3. The central region CER may overlap with the cell plugs CPL that form the three-dimensional memory cell array, shown in FIG. 3.

The second semiconductor layer SEL2 may include a source region 215, a well pickup region 213, and a source pickup region 217. The source region 215 may be doped with the second impurity of the second conductivity type and may be defined in the central region CER. The well pickup region 213 may be doped with a third impurity of the first conductivity type and may be defined in the edge EG. The concentration of the third impurity may be higher than the concentration of the first impurity of the first semiconductor layer SEL1, shown in FIG. 3. The source pickup region 217 may be defined in the source region 215. The source pickup region 217 may be doped with a fourth impurity of the second conductivity type. The concentration of the fourth impurity may be higher than the concentration of the second impurity. The first conductivity type may be a p type, and the second conductivity type may be a n type.

The second semiconductor layer SEL2 may further include an extra region 211 that surrounds the well pickup region 213 in the edge EG. The extra region 211 may include the second impurity of the second conductivity type.

Similarly to the second semiconductor layer SEL2, the first semiconductor layer SEL1, shown in FIG. 3, may include a central region and an edge that surrounds the central region. The central region of the first semiconductor layer SEL1 may overlap with the cell plugs CPL, shown in FIG. 3, and may correspond to the second region AR2, shown in FIG. 3. The edge of the first semiconductor layer SEL1 may correspond to the first region AR1, shown in FIG. 3.

Figure 5:
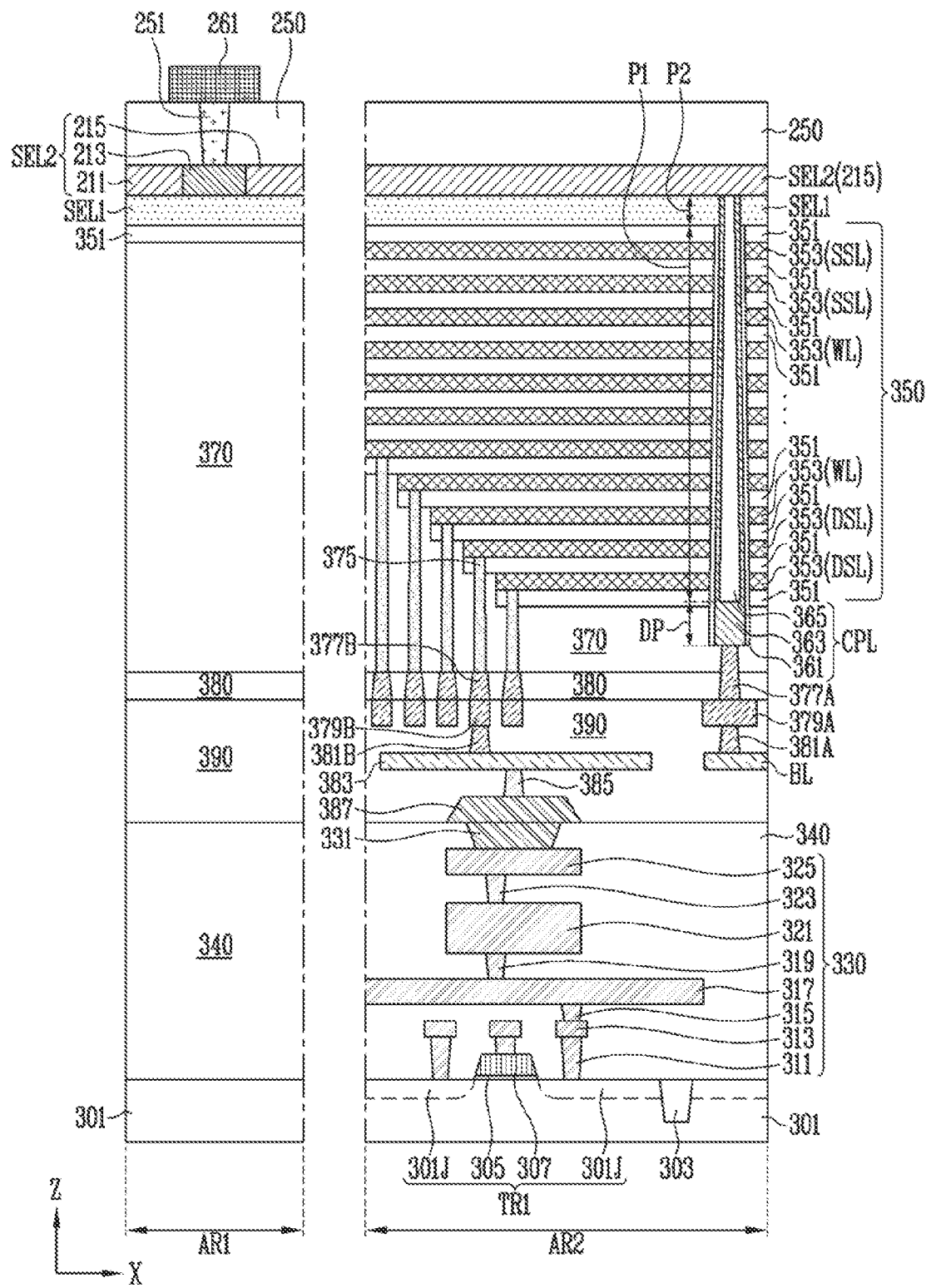
FIG. 5 is a cross-sectional diagram illustrating a first region and a second region of a semiconductor memory device taken along X-Z plane according to an embodiment.
Figure 6:
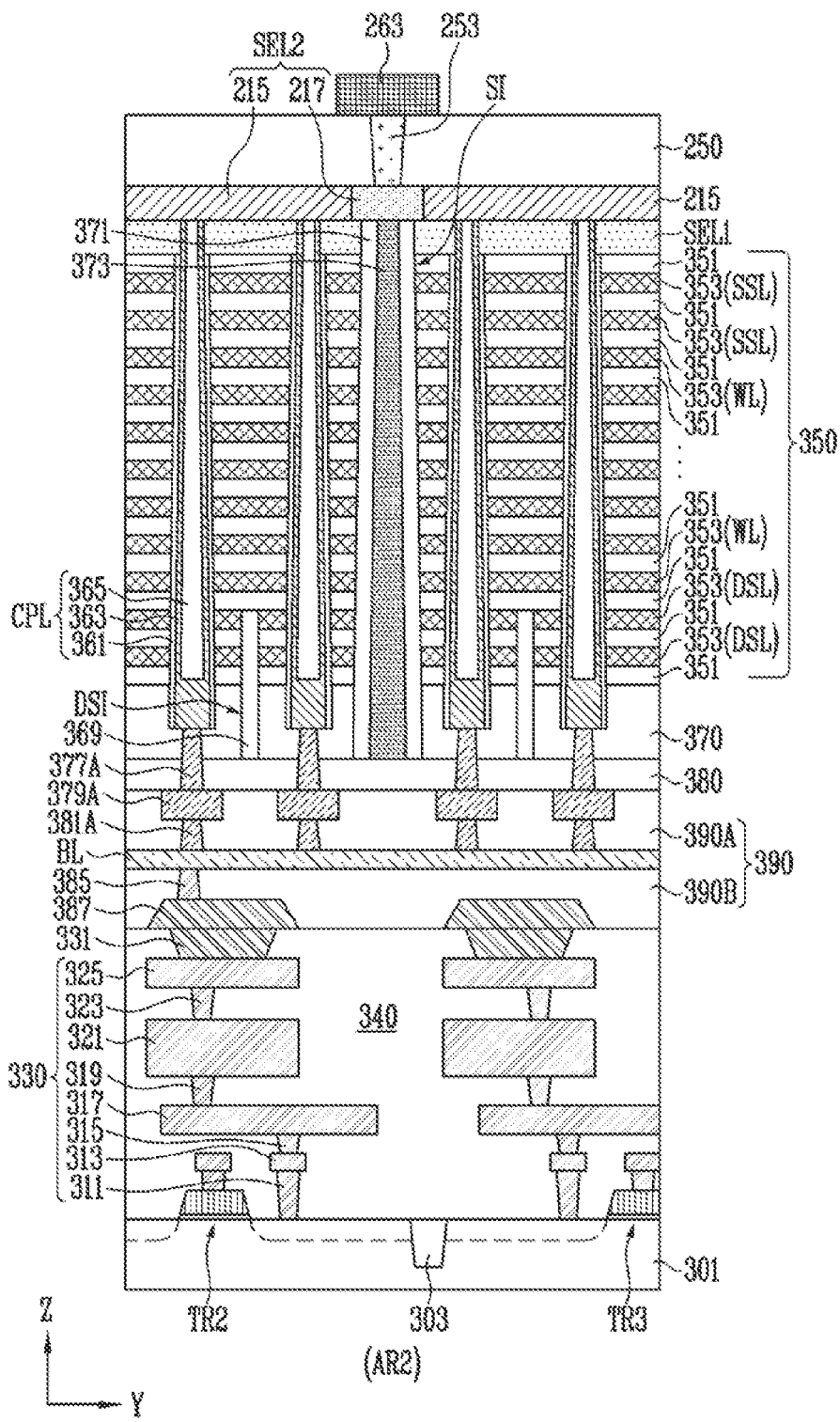
FIG. 6 is a cross-sectional diagram illustrating a second region of a semiconductor memory device taken along Y-Z plane according to an embodiment.
Figure 7:
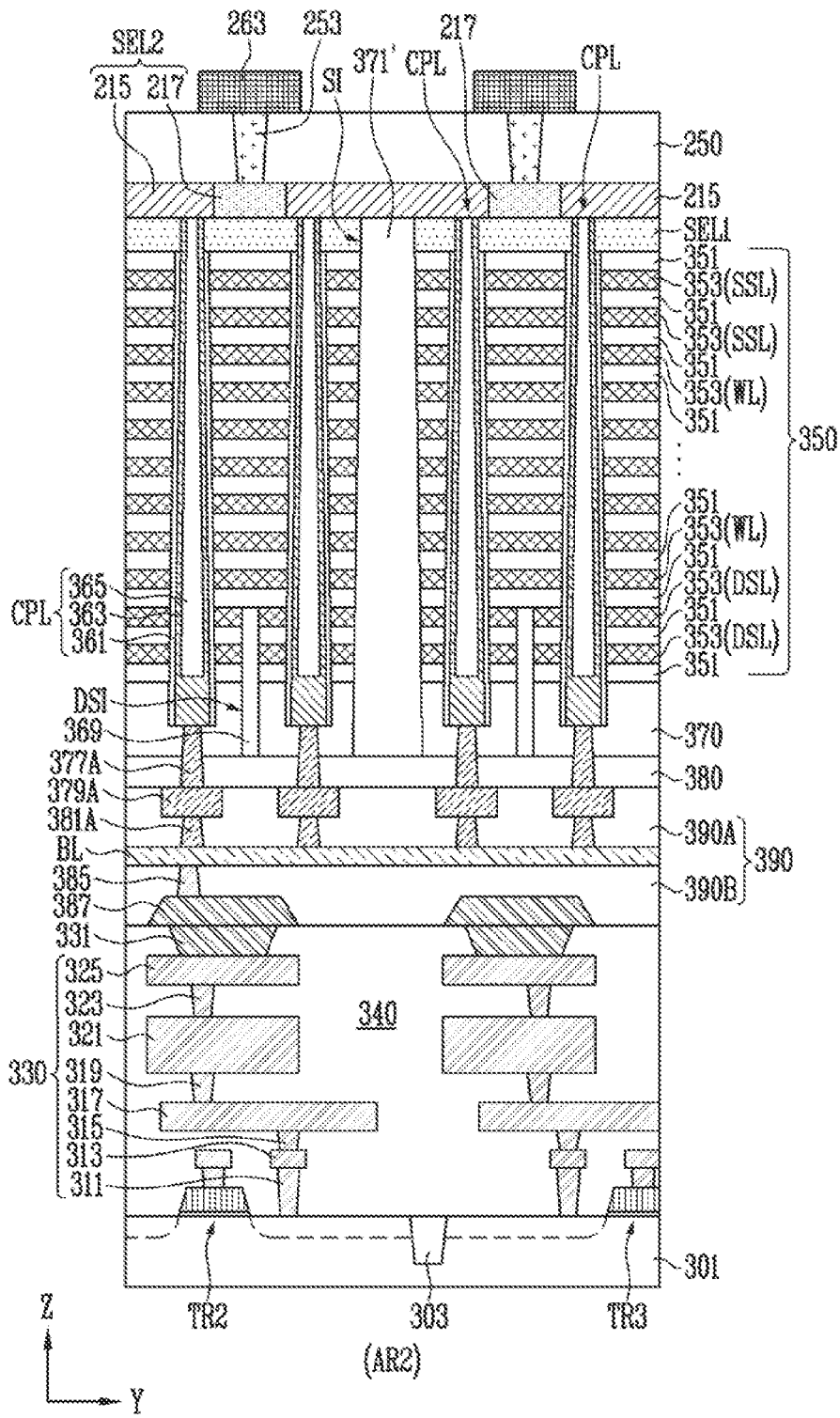
FIG. 7 is a cross-sectional diagram illustrating a second region of a semiconductor memory device taken along Y-Z plane according to an embodiment.

FIG. 5 is a cross-sectional diagram illustrating the first region AR1 and the second region AR2 of the semiconductor memory device taken along X-Z plane according to an embodiment. FIG. 6 is a cross-sectional diagram illustrating the second region AR2 of the semiconductor memory device taken along Y-Z plane according to an embodiment. FIG. 7 is a cross-sectional diagram illustrating the second region AR2 of the semiconductor memory device taken along Y-Z plane according to an embodiment. FIG. 7 illustrates a modification of the embodiment shown in FIG. 6.

Referring to FIGS. 5, 6, and 7, the peripheral circuit structure of the semiconductor memory device may include a substrate 301 and transistors TR1, TR2, and TR3.

The substrate 301 may be a semiconductor substrate, such as a silicon substrate or a germanium substrate. The substrate 301 may include active regions that are divided by isolation layers 303.

The transistors TR1, TR2, and TR3 may form a part of the peripheral circuit structure 190, shown in FIG. 1. According to an embodiment, the transistors TR1, TR2, and TR3 may include the transistors TR1 that form the row decoder 120, shown in FIG. 1, and the transistors TR2 and TR3 that form the page buffer 160, shown in FIG. 1.

Each of the transistors TR1, TR2, and TR3 may include a gate insulating layer 305, a gate electrode 307, and junctions 301J. The gate insulating layer 305 and the gate electrode 307 may be stacked over the substrate 301 in the active region. The junctions 301J may be provided as a source region and a drain region. The junctions 301J may be provided by doping at least one of the n-type impurity and the p-type impurity into an active region that is exposed at both sides of the gate electrode 307.

The semiconductor memory device may include first interconnections 330 that are connected to the peripheral circuit structure and first conductive bonding patterns 331.

The first interconnections 330 may include a plurality of conductive patterns 311, 313, 315, 317, 319, 321, 323, and 325 that are connected to the transistors TR1, TR2, and TR3. The plurality of conductive patterns 311, 313, 315, 317, 319, 321, 323, and 325 may have various structures.

The first conductive bonding patterns 331 may be connected to the first interconnections 330. The first conductive bonding patterns 331 may be connected to the transistors TR1, TR2, and TR3 via the first interconnections 330.

The substrate 301 may be covered by a first insulating structure 340. The transistors TR1, TR2, and TR3, the first interconnections 330, and the first conductive bonding patterns 331 may be embedded in the first insulating structure 340. The first insulating structure 340 may include two or more insulating layers.

The bit line BL, gate stacked structures 350, the cell plugs CPL, the first semiconductor layer SEL1, and the second semiconductor layer SEL2 of the memory cell array may be disposed over the first insulating structure 340 and the first conductive bonding patterns 331.

The semiconductor memory device may include a metal wire 383 that is disposed on the same level as the bit line BL. The metal wire 383 may be spaced apart from the bit line BL. Conductive materials that are included in the metal wire 383 and the bit line BL may be various.

The cell plugs CPL may be surrounded by the gate stacked structures 350 that are disposed between the bit line BL and the first semiconductor layer SEL1 Each of the cell plugs CPL may include a memory layer 361, a channel layer 363, and a core insulating layer 365.

The channel layer 363 may include a first portion P1 and a second portion P2 that extends from the first portion P1 in a longitudinal direction of the channel layer 363. According to an embodiment, the longitudinal direction of the channel layer 363 may be the Z-axis direction. The channel layer 363 may include a drain stage DP that extends from the first portion P1 towards a direction that is opposite to the direction in which the second portion P2 extends. The channel layer 363 may serve as a channel region of a memory cell string and may include a semiconductor material. According to an embodiment, the channel layer 363 may include silicon.

The first portion P1 of the channel layer 363 may be surrounded by the gate stacked structure 350. The second portion P2 of the channel layer 363 may protrude farther in the longitudinal direction of the channel layer 363 (for example, in the Z-axis direction) than the gate stacked structure 350. The drain stage DP may be doped with an impurity of the second conductivity type. The drain stage DP may include a portion that is surrounded by the gate stacked structure 350. The length of the portion of the drain stage DP that is surrounded by the gate stacked structure 350 may be controlled in accordance with a design rule.

The core insulating layer 365 may be disposed in a central region of each of the cell plugs CPL. The memory layer 361 may be disposed between the first portion P1 of the channel layer 363 and the gate stacked structure 350. The memory layer 361 may include a blocking insulating layer between the channel layer 363 and the gate stacked structure 350, a data storage layer between the blocking insulating layer and the channel layer 363, and a tunnel insulating layer between the data storage layer and the channel layer 363. The data storage layer may include a material layer that is capable of storing data changed by using Fowler-Nordheim tunneling. The material layer may include a nitride layer that is capable of trapping charges. The tunnel insulating layer may include an insulating material that allows charge tunneling. According to an embodiment, the tunnel insulating layer may include a silicon oxide layer.

Each of the gate stacked structures 350 may include interlayer insulating layers 351 and conductive patterns 353 that are alternately disposed with each other in the longitudinal direction of the channel layer 363. The stacked structure of the interlayer insulating layers 351 and the conductive patterns 353 may be penetrated by the slit SI.

As shown in an embodiment of FIG. 6, a conductive vertical contact 373 and a vertical insulating layer 371 may be disposed in the slit SI. The vertical insulating layer 371 may be disposed on a sidewall of the conductive vertical contact 373. The conductive patterns 353 of each of the gate stacked structures 350 may be insulated from the conductive vertical contact 373 by the vertical insulating layer 371.

As shown in an embodiment of FIG. 7, the slit SI may be filled with a vertical insulating layer 371'.

As shown in FIGS. 5, 6, and 7, the conductive patterns 353 of the gate stacked structures 350 may serve as the drain select lines DSL, the word lines WL, and the source select lines SSL. The drain separation slit DSI that separates the drain select lines DSL may be filled with a select separation insulating layer 369.

Memory cells may be formed at intersections of the channel layers 363 of the cell plugs CPL and the word lines WL. These memory cells may form a three-dimensional memory cell array. Drain select transistors may be formed at intersections of the channel layers 363 of the cell plugs CPL and the drain select lines DSL. Source select transistors may be formed at intersections of the channel layers 363 of the cell plugs CPL and the source select lines SSL. At least one drain select transistor, a plurality of memory cells, and at least one source select transistor may be coupled in series by each of the channel layers 363.

Each of the gate stacked structures 350 may have a stepped structure. The gate stacked structures 350 and the cell plugs CPL may be covered by a first insulating layer 370. The first insulating layer 370 may be formed between the level at which the bit line BL is disposed and the gate stacked structures 350. The slit SI and the drain separation slit DSI may pass through the first insulating layer 370.

The first insulating layer 370 may be penetrated by gate vertical contacts 375. The gate vertical contacts 375 may overlap with stepped structures of the gate stacked structures 350 in a one-to-one manner. The gate vertical contacts 375 may contact the conductive patterns 353 in a one-to-one manner.

The semiconductor memory device may include a second insulating layer 380 between the level at which the bit line BL is disposed and the first insulating layer 370 and a second insulating structure 390 between the second insulating layer 380 and the first insulating structure 340. The bit line BL and the metal wire 383 may be embedded in the second insulating structure 390. The second insulating structure 390 may include two or more insulating layers. The second insulating structure 390 may include a layer of a first level 390A between the level at which the bit line BL is disposed and the second insulating layer 380 and a layer of a second level 390B between the level at which the bit line BL is disposed and the first insulating structure 340.

The second insulating layer 380 and the layer of the first level 390A may be penetrated by inter-channel-bit connection structures 377A, 379A, and 381A and inter-gate-wire connection structures 377B, 379B, and 381B. The inter-channel-bit connection structures 377A, 379A, and 381A and the inter-gate-wire connection structures 377B, 379B, and 381B may include conductive patterns with various structures.

According to an embodiment, the inter-channel-bit connection structures 377A, 379A, and 381A may include a channel contact 377A, a first contact pad 379A, and a bit line contact 381A. The channel contact 377A may extend from the channel layer 363 towards the bit line BL and may pass through the first insulating layer 370 and the second insulating layer 380. The first contact pad 379A may contact the channel contact 377A and may be embedded in the layer of the first level 390A of the second insulating structure 390. The bit line contact 381A may couple the first contact pad 379A to the bit line BL and may be embedded in the layer of the first level 390A of the second insulating structure 390.

According to an embodiment, the inter-gate-wire connection structures 377B, 379B, and 381B may include a gate contact 377B, a second contact pad 379B, and a wire contact 381B. The gate contact 377B may contact one of the gate vertical contacts 375 and may pass through the second insulating layer 380. The second contact pad 379B may contact the gate contact 377B and may be embedded in the layer of the first level 390A of the second insulating structure 390. The wire contact 381B may couple the second contact pad 379B to the metal wire 383 and may be embedded in the layer of the first level 390A of the second insulating structure 390.

The bit line BL and the metal wire 383 may be connected to the first conductive bonding patterns 331 via second interconnections 385 and second conductive bonding patterns 387. The second interconnections 385 and the second conductive bonding patterns 387 may be embedded in the layer of the second level 390B of the second insulating structure 390. The second conductive bonding patterns 387 may be bonded to the first conductive bonding patterns 331. The second interconnections 385 may include conductive patterns in various structures. The second interconnections 385 may couple the bit line BL and the metal wire 383 to the second conductive bonding patterns 387.

The first semiconductor layer SEL1 may extend from the first region AR1 to the second region AR2 of the semiconductor memory device in the X-Y plane. The first semiconductor layer SEL1 may contact a sidewall of the second portion P2 of the channel layer 363. The first semiconductor layer SEL1 may surround the sidewall of the second portion P2 of the channel layer 363 and may extend along the X-Y plane to overlap with a three-dimensional memory cell array defined by each of the gate stacked structures 350 and the cell plugs CPL.

As shown in an embodiment of FIG. 6, the first semiconductor layer SEL1 may surround the conductive vertical contact 373. The vertical insulating layer 371 may extend between the first semiconductor layer SEL1 and the conductive vertical contact 373.

As shown in an embodiment of FIG. 7, the first semiconductor layer SEL1 may surround the vertical insulating layer 371'.

Referring to FIGS. 5, 6, and 7, the second semiconductor layer SEL2 may cover the first semiconductor layer SEL1 and the channel layers 363 of the cell plugs CPL. The second semiconductor layer SEL2 may extend from the first region AR1 to the second region AR2 of the semiconductor memory device in the X-Y plane. The second semiconductor layer SEL2 may include the edge EG that is disposed in the first region AR1 and the central region CER that is disposed in the second region AR2.

The extra region 211 and the well pickup region 213 of the second semiconductor layer SEL2 may be disposed in the first region AR1 without overlapping with the conductive patterns 353 and the cell plugs CPL. The well pickup region 213 may contact a region of the first semiconductor layer SEL1 that does not overlap with the conductive patterns 353.

A conductive well contact 251 may be connected to the well pickup region 213. The conductive well contact 251 may extend from the well pickup region 213 in the Z direction.

The source region 215 of the second semiconductor layer SEL2 may be disposed in the second region AR2 to overlap with the three-dimensional memory cell array. Each of the source region 215 and the conductive vertical contact 373 of the second semiconductor layer SEL2 may serve as a common source line.

The source pickup region 217 of the second semiconductor layer SEL2 may be formed in the second semiconductor layer SEL2 in the second region AR2.

As shown in an embodiment of FIG. 6, the source pickup region 217 of the second semiconductor layer SEL2 may be defined as a region that is doped with the fourth impurity of the second conductivity type in a part of the source region 215 that does not overlap with the conductive patterns 353 and the well pickup region 213. According to an embodiment, the source pickup region 217 may be formed in the second semiconductor layer SEL2 that overlaps with the conductive vertical contact 373. The conductive vertical contact 373 may extend in the same longitudinal direction as the channel layer 363 from the source pickup region 217. The source pickup region 217 may be connected to a conductive source contact 253 that extends from the source pickup region 217 in a direction that is opposite to the direction in which the conductive vertical contact 373 extends.

As shown in an embodiment of FIG. 7, the source pickup region 217 of the second semiconductor layer SEL2 may be defined as a region that is doped with the fourth impurity of the second conductivity type in a part of the source region 215 that overlaps with the conductive patterns 353. The source pickup region 217 may be formed to avoid overlapping with the channel layers 363 of the cell plugs CPL. According to an embodiment, the source pickup region 217 may overlap with the gate stacked structures 350 between the cell plugs CPL. The source pickup region 217 may be connected to the conductive source contact 253 that extends away from the gate stacked structures 350.

Referring to FIGS. 5, 6, and 7, the conductive well contact 251 and the conductive source contact 253 may pass through an upper insulating layer 250 that is disposed over the second semiconductor layer SEL2. The conductive well contact 251 and the conductive source contact 253 may be connected to upper wires 261 and 263 that are disposed over the upper insulating layer 250. The upper wires 261 and 263 may include a first upper wire 261 and a second upper wire 263.

The first upper wire 261 may be connected to the first semiconductor layer SEL1 that is a well region via the conductive well contact 251. The first upper wire 261 may transfer an erase voltage during an erase operation.

The second upper wire 263 may be connected to the source region 215 of the second semiconductor layer SEL2 via the conductive source contact 253. The second upper wire 263 may transfer a source voltage for discharge during a read operation or a verify operation.

The first semiconductor layer SEL1 may include the first impurity of the first conductivity type and may contact the channel layer 363. The first conductivity type may be the p type. Accordingly, a hole that is a majority carrier of the first semiconductor layer SEL1 may be supplied to the channel layer 363 during the erase operation.

A read voltage or a verify voltage may be applied to a selected word line that is coupled to a selected memory cell and a source voltage (for example, a ground voltage) for discharging may be applied to the source region 215 during the read operation or the verify operation. The source region 215 of the second semiconductor layer SEL2 may include the second impurity of the second conductivity type and may contact the channel layer 363. The second conductivity type may be the n type. Accordingly, when the level of a threshold voltage of the selected memory cell is lower than the level of the read voltage or the verify voltage that is applied to the selected word line, a voltage that is precharged to the bit line BL may be discharged through the source region 215 via the channel layer 363 during the read operation or the verify operation.

Figure 8:
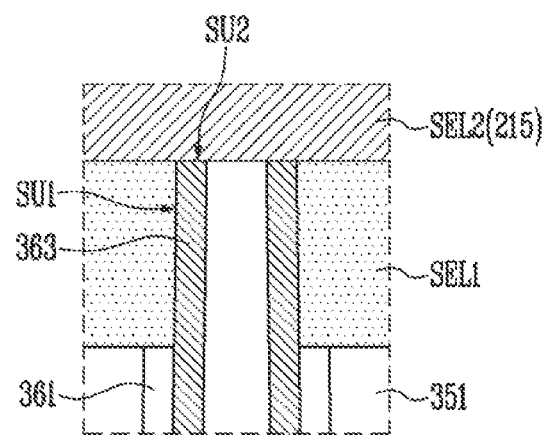
FIG. 8 is an enlarged cross-sectional diagram illustrating a part of a semiconductor memory device according to an embodiment.

FIG. 8 is an enlarged cross-sectional diagram illustrating a part of the semiconductor memory device 100 according to an embodiment.

Referring to FIG. 8, the channel layer 363 may have a first contact surface SU1 that contacts the first semiconductor layer SEL1 and a second contact surface SU2 that contacts the second semiconductor layer SEL2. The hole from the first semiconductor layer SEL1 may be supplied to the channel layer 363 through the first contact surface SU1 of the channel layer 363. The second semiconductor layer SEL2 may provide a discharge path through the source region 215 that is coupled to the second contact surface SU2.

The memory layer 361 may partially surround a sidewall of the channel layer 363 such that the first contact surface SU1 and the second contact surface SU2 of the channel layer 363 are opened.

Figure 9A:
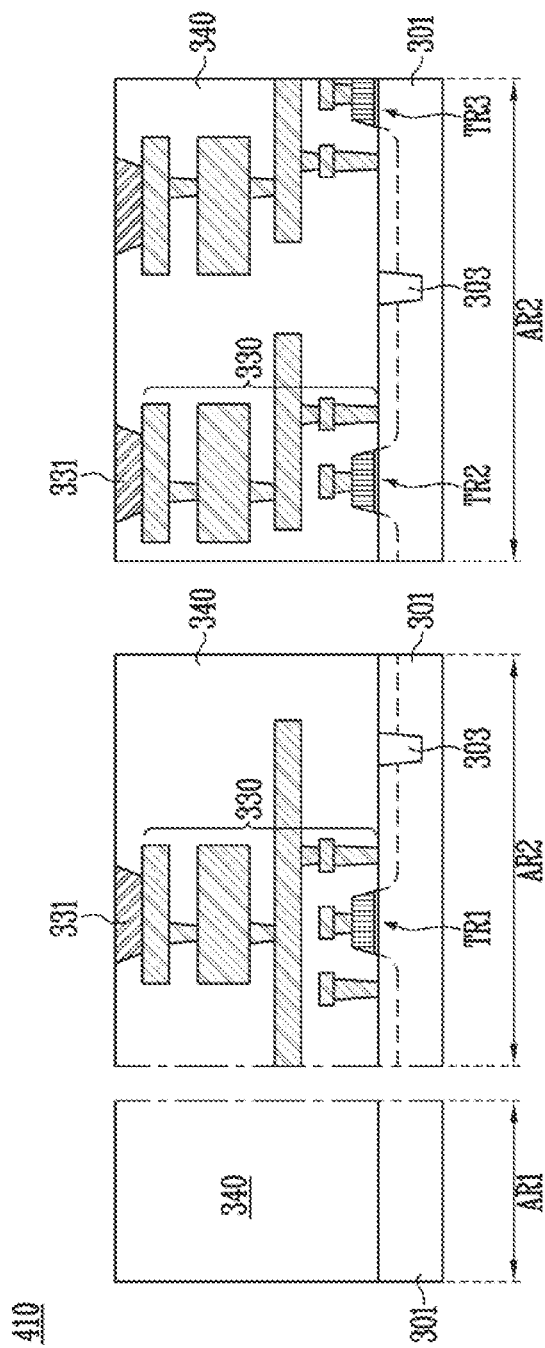
FIGS. 9A to 9C are cross-sectional diagrams illustrating a method of manufacturing a semiconductor memory device according to an embodiment.
Figure 9B:
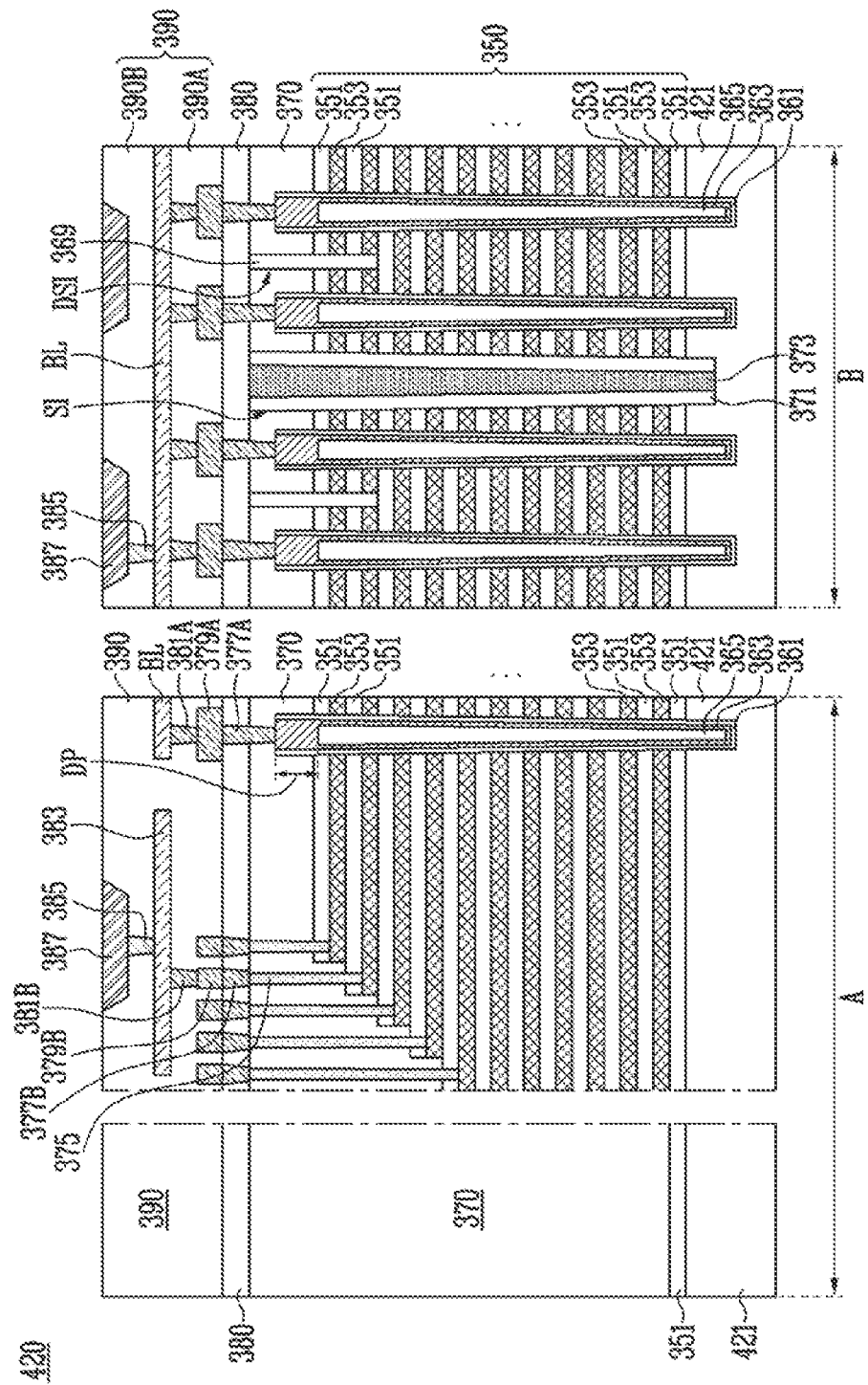
Figure 9C:
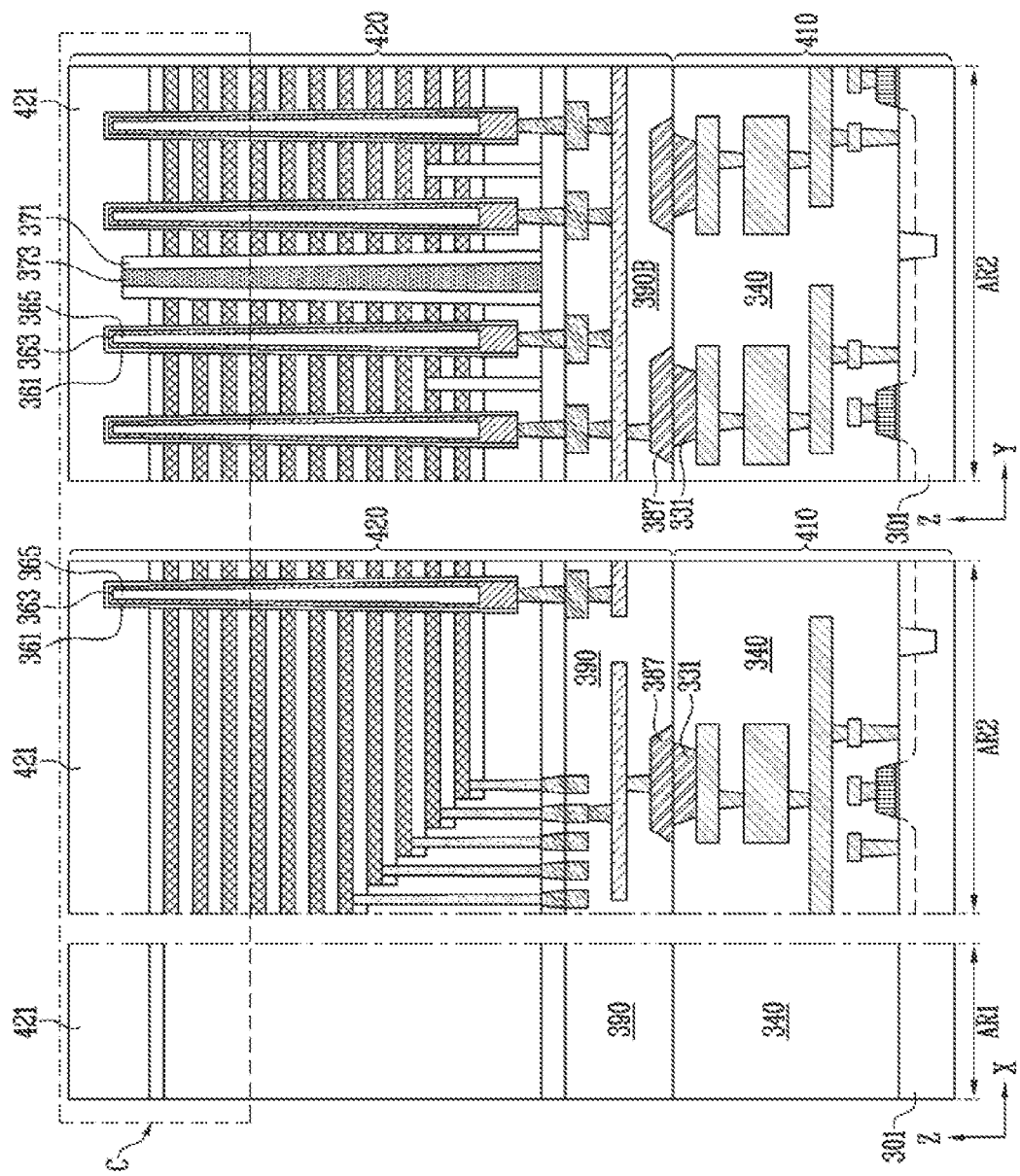

FIGS. 9A to 9C are cross-sectional diagrams illustrating a method of manufacturing the semiconductor memory device according to an embodiment.

Referring to FIG. 9A, a circuit structure 410 that forms the first region AR1 and the second region AR2 of the semiconductor memory device may be formed. The circuit structure 410 may include the peripheral circuit structure, the first interconnections 330 that are connected to the peripheral circuit structure, and the first conductive bonding patterns 331 that are connected to the first interconnections 330.

Forming the circuit structure 410 may include forming the peripheral circuit structure with the plurality of transistors TR1, TR2, and TR3. The plurality of transistors TR1, TR2, and TR3 may be formed in the active regions of the substrate 301 that are divided by the isolation layers 303. The plurality of transistors TR1, TR2, and TR3 may be configured in the same manner as described above with reference to FIGS. 5, 6, and 7. Accordingly, a detailed description already described above will be omitted for the sake of brevity.

Forming the circuit structure 410 may further include forming the first interconnections 330 and the first conductive bonding patterns 331 that are embedded in the first insulating structure 340. The first interconnections 330 and the first conductive bonding patterns 331 may be configured in the same manner as described above with reference to FIGS. 5, 6, and 7. Accordingly, a detailed description already described above will be omitted for the sake of brevity.

Referring to FIG. 9B, a preliminary memory array 420 may be formed over a sacrificial substrate 421. The sacrificial substrate 421 may be a silicon layer. Cross-sectional diagram A in FIG. 9B is taken along a direction that intersects the bit line BL, and cross-sectional diagram B in FIG. 9B is taken along a direction that is parallel with the bit line BL.

The preliminary memory array 420 may include the three-dimensional memory cell array, the gate vertical contacts 375 and the inter-channel-bit connection structures 377A, 379A, and 381A that are connected to the three-dimensional memory cell array, the inter-gate-wire connection structures 377B, 379B, and 381B that are connected to the gate vertical contacts 375, the metal wire 383 that is connected to the inter-gate-wire connection structures 377B, 379B, and 381B, the bit line BL that is connected to the inter-channel-bit connection structures 377A, 379A, and 381A, the second interconnections 385 that are connected to the metal wire 383 and the bit line BL, and the second conductive bonding patterns 387 that are connected to the second interconnections 385.

The three-dimensional memory cell array may include the gate stacked structure 350 that is disposed over the sacrificial substrate 421 and the channel layer 363 that is surrounded by the gate stacked structure 350 with the memory layer 361 interposed therebetween. The three-dimensional memory cell array may be covered by the first insulating layer 370.

The gate stacked structure 350 may include the interlayer insulating layers 351 and the conductive patterns 353 that are alternately stacked with each other over the sacrificial substrate 421. The interlayer insulating layers 351 and the conductive patterns 353 may be penetrated by the slit SI and some of the conductive patterns 353 may be further penetrated by the drain separation slit DSI as well as the slit SI. The slit SI may be filled with the vertical insulating layer 371 and the conductive vertical contact 373 or may be filled with the vertical insulating layer 371' as shown in FIG. 7. The drain separation slit DSI may be filled with the select separation insulating layer 369.

The memory layer 361 may extend along a surface of a hole that passes through the gate stacked structure 350. The hole may extend into the sacrificial substrate 421. The channel layer 363 may extend along an inner wall of the memory layer 361. The channel layer 363 may extend into the sacrificial substrate 421 and the memory layer 361 may extend between the sacrificial substrate 421 and the channel layer 363. The central region of the hole may be filled with the core insulating layer 365. The channel layer 363 may include the drain stage DP with the n-type impurity. The drain stage DP may cover an upper end of the core insulating layer 365 that faces a direction that is opposite to a direction towards the sacrificial substrate 421.

The inter-channel-bit connection structures 377A, 379A, and 381A, the inter-gate-wire connection structures 377B, 379B, and 381B, the metal wire 383, the bit line BL, the second interconnections 385, and the second conductive bonding patterns 387 may be embedded in the second insulating layer 380 and the second insulating structure 390. The second insulating structure 390 may include the layer of the first level 390A between the bit line BL and the second insulating layer 380 and the layer of the second level 390B over the bit line BL. The inter-channel-bit connection structures 377A, 379A, and 381A, the inter-gate-wire connection structures 377B, 379B, and 381B, the metal wire 383, the bit line BL, the second interconnections 385, the second conductive bonding patterns 387, the second insulating layer 380, and the second insulating structure 390 may be configured in the same manner as described above with reference to FIGS. 5, 6, and 7. Accordingly, a detailed description already described above will be omitted for the sake of brevity.

Referring to FIG. 9C, the circuit structure 410 may be aligned with the preliminary memory array 420 such that the first insulating structure 340 of the circuit structure 410 faces the layer of the second level 390B of the preliminary memory array 420. Subsequently, the preliminary memory array 420 may be connected to the circuit structure 410. According to an embodiment, the preliminary memory array 420 may be connected to the circuit structure 410 by bonding the second conductive bonding patterns 387 of the preliminary memory array 420 to the first conductive bonding patterns 331 of the circuit structure 410.

Some of structures forming the first region AR1 and the second region AR2 of the semiconductor memory device may be provided as shown in the X-Z plane and the Y-Z plane by the processes that are shown in FIGS. 9A to 9C.

FIGS. 10A to 10G are cross-sectional diagrams illustrating an embodiment of processes subsequent to the process shown in FIG. 9C. FIGS. 10A to 10G are enlarged cross-sectional diagrams of region C shown in FIG. 9C.

Referring to FIG. 10A, the sacrificial substrate 421 shown in FIG. 9C may be removed. Subsequently, the memory layer 361 may be partially removed to expose a part of the channel layer 363. Accordingly, the channel layer 363 may be divided into the first portion P1 that is surrounded by the gate stacked structure 350 with the memory layer 361 that is interposed therebetween and the second portion P2 that extends from the first portion P1 and is exposed to an area that is outside of the gate stacked structure 350.

Referring to FIG. 10B, a preliminary first semiconductor layer 200 may be formed to cover the channel layer 363 and the gate stack structure 350. The preliminary first semiconductor layer 200 may extend along the X-Y plane. The preliminary first semiconductor layer 200 may be a doped semiconductor layer with the first impurity of the first conductivity type. The first conductivity type may be the p type.

Referring to FIG. 10C, the first semiconductor layer SEL1 surrounding the sidewall of the second portion P2 of the channel layer 363 may be defined by planarizing the preliminary first semiconductor layer 200 shown in FIG. 10B. The planarization of the preliminary first semiconductor layer 200 may be performed by a Chemical Mechanical Polishing (CMP) method. According to an embodiment, a part of the channel layer 363 may be removed and the core insulating layer 365 may be exposed by the planarization. The first semiconductor layer SEL1 may include an edge 200EG that protrudes farther in a direction intersecting the channel layer 363 than the conductive patterns 353.

Subsequently, an impurity 431 for controlling a threshold voltage may be injected into a part of the first portion P1 of the channel layer 363 that is adjacent to the second portion P2 of the channel layer 363 as indicated in regions D shown in FIG. 10C. The impurity 431 for controlling the threshold voltage may include boron.

Referring to FIG. 10D, a preliminary second semiconductor layer 210 may be formed over the first semiconductor layer SEL1. The preliminary second semiconductor layer 210 may include the second impurity of the second conductivity type that is the opposite of the first conductivity type. The second conductivity type may be the n type. The preliminary second semiconductor layer 210 may contact a part of the second portion P2 of the channel layer 363 that is opened by the first semiconductor layer SEL1 and may contact the first semiconductor layer SEL1 The preliminary second semiconductor layer 210 may contact the conductive vertical contact 373.

The preliminary second semiconductor layer 210 may extend along the X-Y plane. The preliminary second semiconductor layer 210 may include an edge 210EG that protrudes farther in a direction that intersects the channel layer 363 than the conductive patterns 353. The preliminary second semiconductor layer 210 may include a central region 210CER that is surrounded by the edge 210EG.

Figure 10E:
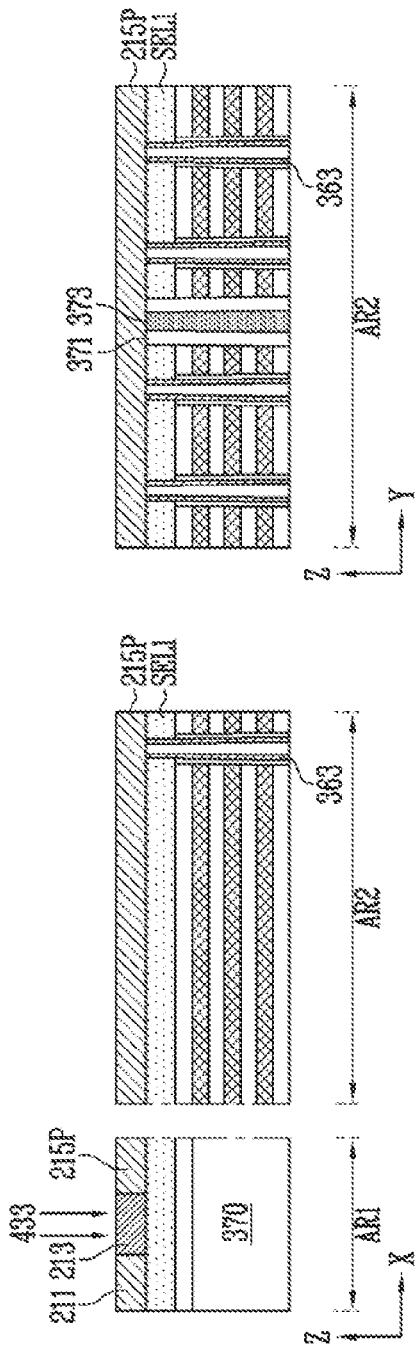

Referring to FIG. 10E, a third impurity 433 of the first conductivity type may be injected into the edge 210EG of the preliminary second semiconductor layer 210, shown in FIG. 10D. Accordingly, the well pickup region 213 that contacts the first semiconductor layer SEL1 may be formed.

The extra region 211 with the second impurity and a preliminary source region 215P with the second impurity may be divided by the well pickup region 213. The preliminary source region 215P may be defined in the central region 210CER of the preliminary second semiconductor layer 210, shown in FIG. 10D. The concentration of the third impurity in the well pickup region 213 may be higher than the concentration of the first impurity in the first semiconductor layer SEL1.

Figure 10F:
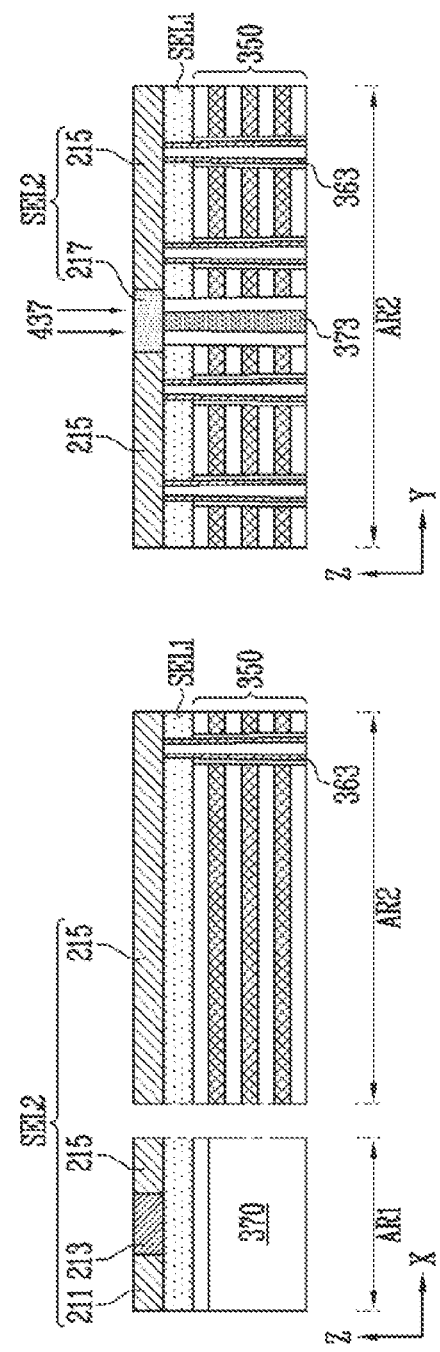

Referring to FIG. 10F, the fourth impurity of the second conductivity type may be injected into a part of the central region 210CER of the preliminary second semiconductor layer 210, shown in FIG. 10D. Accordingly, the source pickup region 217 may be formed. The remaining part of the central region 210CER of the preliminary second semiconductor layer 210, except for the part that is injected with the fourth impurity, may be defined as the source region 215.

The concentration of the fourth impurity in the source pickup region 217 may be higher than the concentration of the second impurity in the source region 215. As shown in FIG. 4, the source region 215 may surround the source pickup region 217.

The source pickup region 217 may be defined in a region that does not overlap with the channel layer 363. According to an embodiment, the source pickup region 217 may overlap with the conductive vertical contact 373. In another embodiment, the source pickup region 217 may overlap with the gate stacked structure 350 that is disposed between the channel layers 363 as shown in FIG. 7.

The second semiconductor layer SEL2 with the source region 215, the source pickup region 217, the extra region 211, and the well pickup region 213 may be defined by the processes that are described with reference to FIGS. 10A to 10F.

Referring to FIG. 10G, the upper insulating layer 250 may be formed over the second semiconductor layer SEL2. Subsequently, the conductive well contact 251 and the conductive source contact 253 that pass through the upper insulating layer 250 may be formed. The conductive well contact 251 may be connected to the well pickup region 213, and the conductive source contact 253 may be connected to the source pickup region 217.

Subsequently, the upper wires 261 and 263 that are connected to the conductive well contact 251 and the conductive source contact 253, respectively, may be formed over the upper insulating layer 250.

Figure 11:
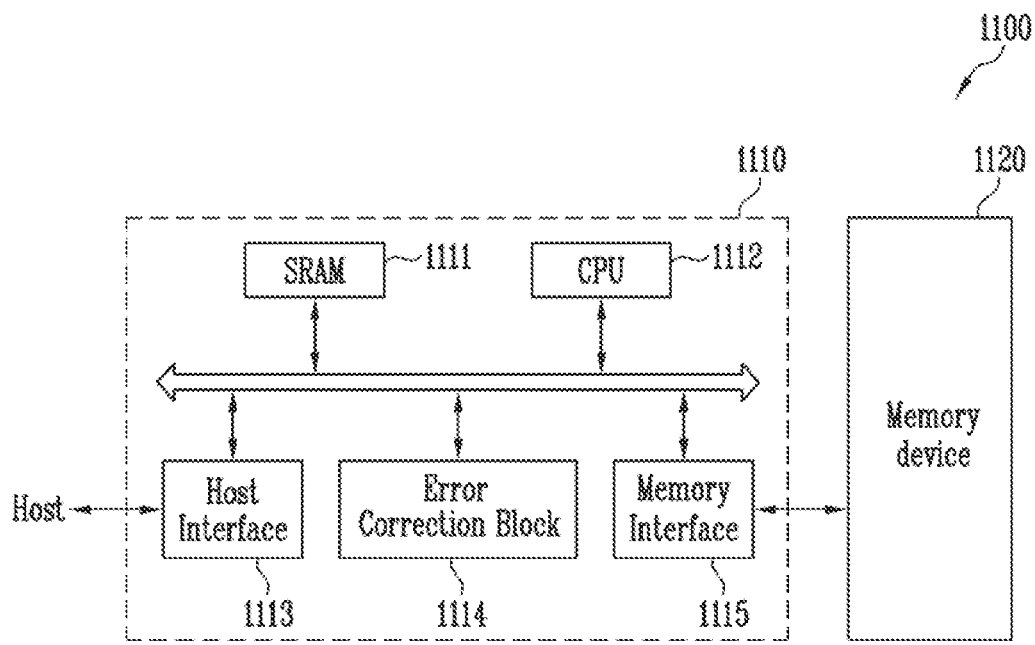
FIG. 11 is a block diagram illustrating a configuration of a memory system according to an embodiment.

FIG. 11 is a block diagram illustrating a configuration of a memory system 1100 according to an embodiment.

Referring to FIG. 11, the memory system 1100 may include a memory device 1120 and a memory controller 1110.

The memory device 1120 may be a multi-chip package including a plurality of flash memory chips. The memory device 1120 may include a first impurity region of the first conductivity type and a second impurity region of the second conductivity type that is the opposite of the first conductivity type. The first and second impurity regions may contact a channel layer of a memory cell array. The first impurity region may serve as a current path during an erase operation, and the second impurity region may serve as a current path during a read operation or a verify operation.

The memory controller 1110 may be configured to control the memory device 1120 and may include Static Random Access Memory (SRAM) 1111, a Central Processing Unit (CPU) 1112, a host interface 1113, an error correction block 1114, and a memory interface 1115. The SRAM 1111 may serve as operational memory of the CPU 1112, the CPU 1112 may perform general control operations for data exchange of the memory controller 1110, and the host interface 1113 may include a data exchange protocol of a host accessing the memory system 1100. The error correction block 1114 may detect and correct error that is included in data that is read from the memory device 1120. The memory interface 1115 may interface with the memory device 1120. The memory controller 1110 may further include Read Only Memory (ROM) that stores code data for interfacing with the host.

The memory system 1100 with the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer System Interface (SCSI), an Enhanced Small Disk Interface (ESDI), and Integrated Drive Electronics (IDE).

Figure 12:
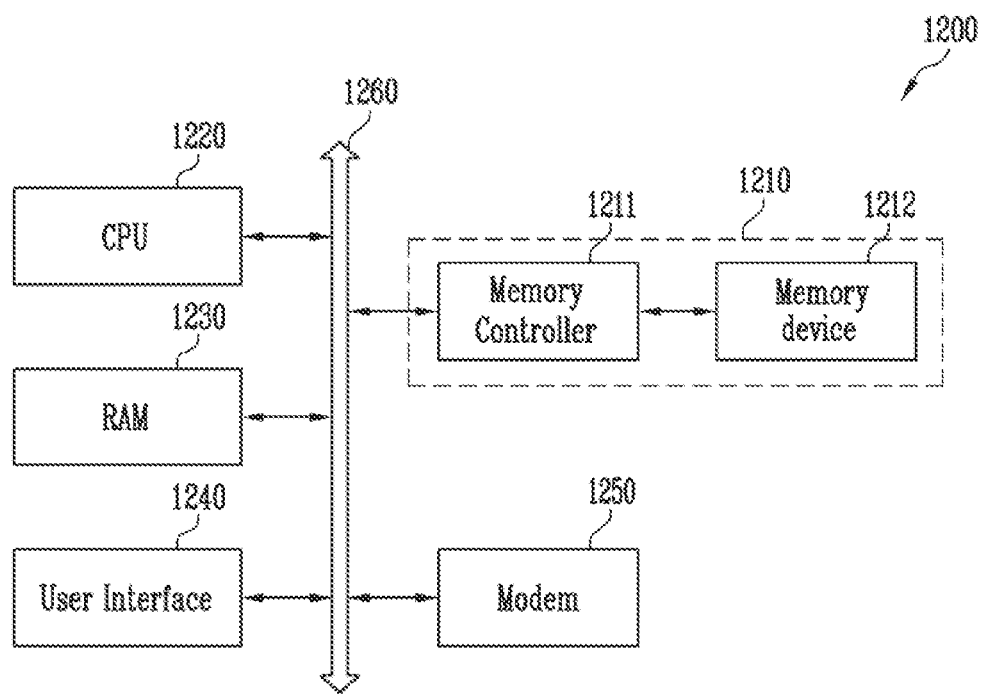
FIG. 12 is a block diagram illustrating a configuration of a computing system according to an embodiment.

FIG. 12 is a block diagram illustrating a configuration of a computing system according to an embodiment.

Referring to FIG. 12, the computing system 1200 may include a CPU 1220, Random Access Memory (RAM) 1230, a user interface 1240, a modem 1250, and a memory system 1210 that are electrically coupled to a system bus 1260. When the computing system 1200 is a mobile device, a battery for supplying an operating voltage to the computing system 1200 may be further included, and an application chipset, an image processor, mobile DRAM, and the like may be further included.

The memory system 1210 may include a memory device 1212 and a memory controller 1211.

The memory device 1212 may include a first impurity region of the first conductivity type and a second impurity region of the second conductivity type that is the opposite of the first conductivity type. The first and second impurity regions may contact a channel layer of a memory cell array. The first impurity region may serve as a current path during an erase operation, and the second impurity region may serve as a current path during a read operation or a verify operation.

The memory controller 1211 may be configured in the same manner as the memory controller 1110 described above with reference to FIG. 11.

According to embodiments of the present disclosure, because an erase operation based on a majority carrier may be implemented, operational reliability of a semiconductor memory device may be improved.

What is claimed is:

1. A semiconductor memory device, comprising:
   a channel layer with a first portion and a second portion, the first portion and the second portion extending in a longitudinal direction;
   a gate stacked structure surrounding the first portion of the channel layer;
   a first semiconductor layer including a well region that is doped with a first impurity of a first conductivity type, the first semiconductor layer contacting a sidewall of the second portion of the channel layer; and
   a second semiconductor layer covering the first semiconductor layer and the channel layer,
   wherein the second semiconductor layer includes a source region that is doped with a second impurity of a second conductivity type that is opposite to the first conductivity type, and
   wherein the channel layer contacts both the well region of the first semiconductor layer and the source region of the second semiconductor layer.

2. The semiconductor memory device of claim 1, further comprising a memory layer that is disposed between the first portion of the channel layer and the gate stacked structure,
   wherein the gate stacked structure includes conductive patterns and interlayer insulating layers that are alternately stacked with each other in the longitudinal direction.

3. The semiconductor memory device of claim 1, wherein the second semiconductor layer further includes a well pickup region that is doped with a third impurity of the first conductivity type, and
   wherein a concentration of the third impurity in the well pickup region is higher than a concentration of the first impurity in the first semiconductor layer.

4. The semiconductor memory device of claim 3, wherein the well pickup region contacts a part of the first semiconductor layer.

5. The semiconductor memory device of claim 3, wherein the second semiconductor layer further includes a source pickup region that is doped with a fourth impurity of the second conductivity type in the source region, and
   wherein a concentration of the fourth impurity in the source pickup region is higher than a concentration of the second impurity in the source region.

6. The semiconductor memory device of claim 5, wherein the source pickup region is disposed in a part of the source region that does not overlap with the channel layer and the well pickup region.

7. The semiconductor memory device of claim 5, further comprising:
   a conductive vertical contact extending in the same longitudinal direction as the channel layer from the source pickup region;
   an insulating layer between the conductive vertical contact and the gate stacked structure;
   a conductive source contact extending in a direction that is opposite to a direction in which the conductive vertical contact extends; and
   an upper wire connected to the conductive source contact and transferring a source voltage during a read operation or a verify operation.

8. The semiconductor memory device of claim 5, wherein the gate stacked structure includes conductive patterns that are stacked to be spaced apart from each other in the longitudinal direction, and
   wherein the source pickup region overlaps with the conductive patterns.

9. The semiconductor memory device of claim 8, further comprising:
   a conductive source contact extending from the source pickup region and extending away from the gate stacked structure; and
   an upper wire connected to the conductive source contact and transferring a source voltage during a read operation or a verify operation.

10. The semiconductor memory device of claim 3, further comprising:
    a conductive well contact connected to the well pickup region; and an upper wire connected to the conductive well contact and transferring an erase voltage during an erase operation.

11. The semiconductor memory device of claim 1, further comprising:
a peripheral circuit structure overlapping with the gate stacked structure; and
a bit line disposed between the peripheral circuit structure and the gate stacked structure.

12. A semiconductor memory device, comprising:
a three-dimensional memory cell array;
a first semiconductor layer overlapping with the three-dimensional memory cell array, the first semiconductor layer including a well region that is doped with a first impurity of a first conductivity type; and
a second semiconductor layer disposed over the first semiconductor layer, the second semiconductor layer including a source region that is doped with a second impurity of a second conductivity type that is opposite to the first conductivity type,
wherein the three-dimensional memory cell array includes channel layers, each with a first contact surface that contacts the well region of the first semiconductor layer and a second contact surface that contacts the source region of the second semiconductor layer.

13. The semiconductor memory device of claim 12, wherein the second semiconductor layer includes a central region that overlaps with the three-dimensional memory cell array and an edge that surrounds the central region, and
wherein the source region of the second semiconductor layer is formed in the central region of the second semiconductor layer.

14. The semiconductor memory device of claim 12, wherein the second semiconductor layer further includes a well pickup region that is doped with a third impurity of the first conductivity type, and
wherein a concentration of the third impurity in the well pickup region is higher than a concentration of the first impurity in the first semiconductor layer.

15. The semiconductor memory device of claim 14, wherein the second semiconductor layer further includes a central region that overlaps with the three-dimensional memory cell array and an edge that surrounds the central region, and
wherein the well pickup region is formed in the edge of the second semiconductor layer.

16. The semiconductor memory device of claim 12, further comprising a bit line that is spaced apart from the first semiconductor layer with the channel layers that are interposed therebetween, the bit line being connected to the channel layers,
wherein the three-dimensional memory cell array further comprises:
a memory layer surrounding a part of a sidewall of each of the channel layers to open the first contact surface and the second contact surface of each of the channel layers; and
interlayer insulating layers and conductive patterns alternately stacked with each other between the first semiconductor layer and the bit line, the interlayer insulating layers and the conductive patterns surrounding the memory layer.

17. The semiconductor memory device of claim 16, further comprising:
a slit passing through the interlayer insulating layers and the conductive patterns;
a conductive vertical contact in the slit;
an insulating layer on a sidewall of the conductive vertical contact; and
a source pickup region that is doped with a fourth impurity of the second conductivity type in a part of the source region that overlaps with the conductive vertical contact,
wherein a concentration of the fourth impurity in the source pickup region is higher than a concentration of the second impurity in the source region.

18. The semiconductor memory device of claim 16, wherein the second semiconductor layer further includes a source pickup region that is doped with a fourth impurity of the second conductivity type in a part of the source region that overlaps with the conductive patterns but does not overlap with the channel layers, and
wherein a concentration of the fourth impurity in the source pickup region is higher than a concentration of the second impurity in the source region.

19. The semiconductor memory device of claim 12, further comprising a peripheral circuit structure overlapping with the first semiconductor layer with the three-dimensional memory cell array that is interposed therebetween.

20. The semiconductor memory device of claim 12, further comprising:
a first upper wire connected to the first semiconductor layer and transferring an erase voltage during an erase operation; and
a second upper wire connected to the source region and transferring a source voltage during a read operation or a verify operation.

* * * * *